(12) United States Patent
Ballandras et al.

(10) Patent No.: US 7,609,132 B2
(45) Date of Patent: Oct. 27, 2009

(54) HYBRID RESONANT STRUCTURE

(75) Inventors: Sylvain Jean Ballandras, Besancon (FR); William Steichen, Roquefort les Pins (FR); Jeremy Masson, Avanne (FR)

(73) Assignees: Temex SAS, Valbonne (FR); Centre National de la Receheche Scientifique, Paris (FR)

( * ) Notice: Subject to any disclaimer, the term of this patent is extended or adjusted under 35 U.S.C. 154(b) by 208 days.

(21) Appl. No.: 11/494,555

(22) Filed: Jul. 28, 2006

(65) Prior Publication Data

US 2007/0040473 A1      Feb. 22, 2007

(30) Foreign Application Priority Data

Jul. 29, 2005   (FR)   ................................. 05 52397

(51) Int. Cl.
   *H03H 9/00*   (2006.01)
(52) U.S. Cl. .................... 333/187; 310/320; 333/191
(58) Field of Classification Search ................. 333/187, 333/189, 188, 191; 310/320, 321, 324
   See application file for complete search history.

(56) References Cited

U.S. PATENT DOCUMENTS

| | | | |
|---|---|---|---|
| 4,625,185 A * | 11/1986 | Burzi et al. ................. | 333/204 |
| 4,642,508 A | 2/1987 | Suzuki et al. | |
| 5,181,025 A | 1/1993 | Ferguson et al. | |
| 6,087,198 A | 7/2000 | Panasik et al. | |
| 6,121,892 A | 9/2000 | Reindl et al. | |
| 6,144,332 A | 11/2000 | Reindl et al. | |
| 6,214,733 B1 | 4/2001 | Sickmiller | |
| 6,420,820 B1 * | 7/2002 | Larson, III ................. | 310/346 |
| 6,548,942 B1 * | 4/2003 | Panasik ....................... | 310/364 |
| 7,348,714 B2 * | 3/2008 | Inoue et al. ................. | 310/335 |
| 2001/0028285 A1 | 10/2001 | Klee et al. | |
| 2005/0110597 A1 * | 5/2005 | Larson et al. ................ | 333/191 |
| 2005/0140247 A1 * | 6/2005 | Lee ............................ | 310/320 |

(Continued)

FOREIGN PATENT DOCUMENTS

EP            1 742 355         *  4/2005

(Continued)

OTHER PUBLICATIONS

Pao et al., "Analysis and experiment of HBAR frequency spectra and applications to characterize the piezoelectric thin film and to HBAR design", IEEE International Frequency Control Symposium and PDA Exhibition, 2002, pp. 27-35.

(Continued)

*Primary Examiner*—Rexford N Barnie
*Assistant Examiner*—Dylan White
(74) *Attorney, Agent, or Firm*—Buchanan, Ingersoll & Rooney P.C.

(57) ABSTRACT

A bulk wave acoustic resonant structure which is in accordance with the invention allows the difficulties encountered at high frequency, the impossibility of working at low frequency on simple structures and the absence of an adequate coupling level to be overcome. The invention therefore proposes the use of an additional layer of material which covers the upper electrode of a piezoelectric transducer in order to localize the position of maximum intensity of the dynamic stress close to the centre of the piezoelectric layer through the effect of propagation.

The structure that is in accordance with the invention may be associated with Bragg mirrors and various uses are presented.

23 Claims, 3 Drawing Sheets

U.S. PATENT DOCUMENTS

2007/0035207 A1* 2/2007 Kawamura et al. .......... 310/324
2008/0303650 A1* 12/2008 Fagot-Revurat et al. ..... 340/447

FOREIGN PATENT DOCUMENTS

| GB | 2 355 801 A | | 5/2001 |
|---|---|---|---|
| WO | WO 93/13495 A1 | | 7/1993 |
| WO | WO 00/65320 A1 | | 11/2000 |
| WO | WO 01/45967 A1 | | 6/2001 |
| WO | WO 2005107066 | * | 4/2005 |

OTHER PUBLICATIONS

Mansfield et al., "The Development of a New Class of Baw Microwave Acoustic Devices for Ecological Monitoring", IEEE Ultrasonics Symposium-887, 2002, pp. 1-4.

Dubois, "Thin film bulk acoustic wave resonators: a technology overview", MEMSWAVE, Jul. 2-4, 2003, pp. 1-4, vol. 3, Toulouse, France.

French Search Report corresponding to FR 05/52397, issued Apr. 27, 2006, 3 pages.

Camou et al., "Guided elastic waves in GaN-on-sapphire," Electronics Letters, Aug. 2, 2001, pp. 1053-1055, vol. 37, No. 16.

Dovidenko et al., "Aluminum nitride films on different orientations of sapphire and silicon," J. Appl. Phys., Mar. 1, 1996, pp. 2439-2445, vol. 79, No. 5.

Ieki et al., "Microwave Low Insertion Loss Saw Filter By Using ZnO/Sapphire Substrate With Ni Dopant," IEEE MTT-S Digest, 1996, pp. 409-412.

Ruby R.C. et al., "Thin Film Bulk Wave Acoustic Resonators (FBAR) for Wireless Applications," IEEE Ultrasonics Symposium, 2001, pp. 813-821.

* cited by examiner

HYBRID RESONANT STRUCTURE

CROSS-REFERENCE TO PRIORITY/PCT APPLICATIONS

This application claims priority under 35 U.S.C. §119 of FR 05/52397, filed Jul. 29, 2005, hereby expressly incorporated by reference and assigned to the assignee hereof.

BACKGROUND OF THE INVENTION

1. Technical Field of the Invention

The invention belongs to the field of remote measurement of physical quantities, in particular through the use of a radiofrequency link and a passive component. More specifically, the invention relates to resonant structures using bulk waves within piezoelectric films. The structure that is in accordance with the invention is optimized in order to increase its quality factor and coupling coefficient in its frequency range.

The invention also relates to a process for manufacturing such a hybrid structure, and to various uses.

2. Description of Background and/or Related and/or Prior Art

In the area of transponders and/or sensors, narrow band resonant devices are increasingly used, in particular those which operate in the 500 MHz range.

In particular, since the 1920s, resonators based on the vibrations produced in strips of piezoelectric materials have been produced, such as schematically illustrated in FIG. 1, with this type of component 1 being made up of two facing electrodes 2, 3 gripping a plate of piezoelectric material 4. When a radiofrequency field RF is applied to the terminals of the dipole 2, 3 formed in this way, a reverse piezoelectric effect results in the deformation of the plate 4 in accordance with the couplings which are allowed by the crystalline orientation of its component material. A resonance phenomenon is produced when the RF excitation frequency F corresponds to the phase velocity V for the movement that is generated divided by twice the thickness e of the plate (F=V/2e): the displacements at the surface of the plate 4 are then of maximum amplitude, whilst the stresses C reach their maximum values at its centre. Quartz has proven to be the most favored material for this type of application as a result of its thermoelastic properties (high mechanical quality coefficients, the existence of orientations which compensate for the effects of temperature, etc. . . . ).

However, in order to achieve increases in frequency, it becomes necessary to reduce the thickness of usually massive materials to thicknesses e which introduce an element of risk into any industrial application (where the minimum thickness of plates is of the order of 30 μm): for a resonator 1 operating at its fundamental mode at 300 MHz by means of a shear wave at 3500 m·s$^{-1}$, the thickness e of the plate 4 of an quartz AT cut should be of the order of 6 μm. Even using higher harmonics and other quartz cuts (such as BT cuts which allow the use of a wave which is propagated at 5100 m·s$^{-1}$), a frequency of 1 GHz represents the practical limit for the operation of classical bulk wave resonators.

These devices have therefore been supplanted for radiofrequency signal processing applications by passive surface wave components (SAW: "Surface Acoustic Waves") which have shown themselves to be capable of reaching frequency ranges which exceed gigahertz, and have seen a number of applications, such as remote querying of passive sensors. Such surface wave resonant structures, however, involve certain size constraints associated with the acoustic wavelength and even with their configuration, which needs to be of a minimum length in order to carry out their spectral function.

Furthermore, production of thin piezoelectric layers on non-piezoelectric substrates has been developed and it has been shown to be possible to excite bulk waves in piezoelectric films, often with longitudinal polarization and which simultaneously exhibit very high propagation speeds and high levels of piezoelectric coupling (several %). Different thin piezoelectric film bulk resonators 5 have been perfected: Resonators with thin films 6 on a substrate 7 (TFR: "Thin film resonators"), surface machined or bulk machined (FBAR: "Film Bulk Acoustic Resonator", HBAR: "Harmonic Bulk Acoustic Resonator"), are illustrated respectively in FIGS. 2A and 2B, and the Bragg mirror 9 resonator 8 (SMR: "Solidly Mounted Resonator") is shown in FIG. 2C.

The main technological difficulty in manufacturing such a component rests in the elimination, or local reduction in the thickness of the substrate 7 found on the rear face of the layer 5 in order to allow vibrations to be freely established: the substrate 7 which remains beneath the piezoelectric membrane 5 seems likely to generate interference modes. A composite solution was therefore envisaged allowing coupling of the advantages associated with the use of a thin piezoelectric layer 5 whose character differs from that of the substrate 7, based on the operating principles of bulk wave delay lines.

The simplest delay lines are made up of a piezoelectric transducer/propagation material/piezoelectric transducer composite structure in which bulk waves W are propagated: the delay depends on the length of the acoustic path that is traveled. A simplified version of this structure (FIG. 2D) combines the input and output transducers and the acoustic path involves reflection on a flat surface. This last structure 6', the so-called composite resonant structure, exhibits a multiplicity of modes which correspond to the possible harmonics of the fundamental mode of structure 6', whose frequency is always given by the relationship F=V/2e where e is the effective thickness of the thin layer 5/substrate 7' composite plate and where V is the equivalent velocity for the mode, which principally depends on the elastic properties of the substrate 7' (preferably a single crystal), slightly disturbed by the film 5; the polarization is set by the piezoelectric couplings of the film 5. The choice of the thicknesses of the various layers, and in particular of the single-crystalline strip 7' is made so that one of the harmonic resonances of N order for the stack corresponds to the desired operating frequency $F_0$ of the resonator 6'; furthermore, the dimensions given to the structure allows a spectral gap to be obtained between two resonances very much higher than the working frequency band (for example 1.8 MHz for the band centered on 433.92 MHz). Thus the chosen resonance may be selected with precision.

For a composite structure 6' as shown in FIG. 2D, it would seem necessary to obtain an optimum coupling coefficient in order to limit insertion losses. In cases of a layer 5 of AlN deposited on a substrate of silicon 7', even if it is possible to optimize the coupling coefficient value $K_S^2$ by varying the thickness of the substrate 7', obtaining a value of 1‰, the Rayleigh wave coefficient on the quartz which is the lower limit for effective operation of the resonator 6', is subject to the use of the fundamental mode. Such a small coupling coefficient is just compatible with most applications envisaged for remote measurement.

It has certainly been proposed (Shih-Yung Pao et al.: "Analysis and experiment of HBAR frequency spectra and application to characterize the piezoelectric thin film and to HBAR design", *Proceedings of the IEEE International Frequency Control Symposium* 2002; 8A-5) that the thickness of the upper electrode 2 be increased in order to remedy this problem; this optimization of the coupling factor $K_s^2$ is carried out to the detriment of the over-voltage coefficient value for the resonant structure 6' however, and therefore affects its possible use.

SUMMARY OF THE INVENTION

The invention proposes alleviating some problems mentioned above relating to resonant structures.

In particular the invention relates to a resonator which simultaneously overcomes the difficulties encountered at high frequency with bulk wave solutions, the inability to operate at low frequency on simple FBAR structures and the absence of adequate coupling levels when working with composite structures.

For a bulk wave resonator, it has been observed that coupling between the electrical energy and the piezoelectric medium is at a maximum when maximum stress is applied at the middle of the piezoelectric layer. In order to minimize unwanted effects on the over-voltage which are associated with the use of upper electrodes with large mass, the invention proposes the use of a material which covers the upper electrode so as to displace the position of the expansion anti-node within the piezoelectric layer through propagation effects.

In one of its aspects, the invention therefore relates to an acoustic resonance structure which includes a piezoelectric transducer which is made up of two electrodes surrounding a layer of piezoelectric material, advantageously in the form of a thin film. One of the electrodes is set in place on a support and the other is coated with an additional layer whose thickness is determined depending on the thickness of the substrate and the resonator operating parameters, in order to optimize the electro-acoustic density within the piezoelectric zone. The thickness of the additional layer in fact allows the stress anti-node to be displaced inside the stack, which is different to the location of a Bragg mirror, which for its part, allows encapsulation to take place.

The support may be a substrate, advantageously in the form of a strip, or a Bragg mirror positioned on a substrate; the additional layer may also be covered by a Bragg mirror. The resonant structure according to the invention which is equipped with a Bragg mirror may advantageously be fully or partially coated with a protective layer, which may serve as a housing; at least one Bragg mirror is chosen so that its coefficient of reflection is at a maximum close to the structure's resonance frequency.

The substrate may be made up of several materials, which advantageously possess dielectric and mechanical quality factors which are such that the product QF of the resonant structure is above 3 or $5 \cdot 10^{12}$; it preferably involves single crystal quartz, but numerous materials are possible (glass, silica, $La_3Ga_5SiO_{14}$, $La_3Ga_{5.5}Nb_{0.5}O_{14}$, $La_3Ga_{5.5}Ta_{0.5}O_{14}$, $GaPO_4$, sapphire, $LiNbO_3$, $KNbO_3$, $LiTaO_3$, C, SiC, etc....). In the preferred mode of manufacture, the substrate is such that the resonator which is in accordance with the invention is an HBAR, that is, the total active thickness of the resonant structure is greater than one wavelength and therefore the acoustic energy is not confined within the piezoelectric layer but is also present in the substrate.

The piezoelectric layer is advantageously composed of aluminum nitride, which may be deposited by cathode sputtering, for example; if the piezoelectric layer is made up of a single crystal, it may be added using molecular adhesion followed by a reduction in thickness. The electrodes are advantageously metallic layers deposited or integrated onto their support, namely the substrate, Bragg mirror or piezoelectric layer. The additional layer may be piezoelectric in nature or not; it is preferably put in place by epitaxial growth of a single crystal material, but it can also be made of a material such as that used for the substrate.

The resonant structure according to the invention, depending on its use, may be associated with another structure of a similar nature, with a capacitive sensor and/or with an antenna in order to carry out its function as a transponder. The choice of characteristics, in particular of the materials, impedances and dimensions for each resonant structure may allow differential temperature measurements to be made.

The invention in another of its aspects relates to a procedure for the manufacture of such resonant structures.

Using the invention it is possible to considerably increase coupling performances, in particular by a factor of 5 to 10, for example by changing the coupling coefficient to 0.001 for a HBAR resonator composed of a silicon substrate and a piezoelectric film made of aluminum nitride, whereas standard solution give $K_s^2=0.0002$.

BRIEF DESCRIPTION OF THE DRAWINGS

The characteristics and advantages of the invention will be better understood by reading the following description with reference to the appended figures, which are given for illustrative purposes and are in no way restrictive.

DETAILED DESCRIPTION OF BEST MODE AND SPECIFIC/PREFERRED EMBODIMENTS OF THE INVENTION

For a hybrid resonant structure made up of a piezoelectric film, coupling between the electrical energy and the piezoelectric medium is at maximum if the stress maximum is applied at the middle of the piezoelectric layer. In fact the electromechanical coupling, the effects of temperature and stresses and acoustic insulation of the resonator are not first order coupled phenomena and are therefore generally regarded as being independent: the relationship between such phenomena is not trivial.

Thickening of the upper layer therefore allows the stress to be displaced. In particular, this is not a natural effect in HBAR structures since the energy is distributed in the piezoelectric layer 5 and the substrate 7.

In addition, in order to avoid being confronted with significant degradation of the over-voltage coefficient of the resonant structure, it is important that elastic energy be propagated within the layer added onto the electrode.

Figure 1:
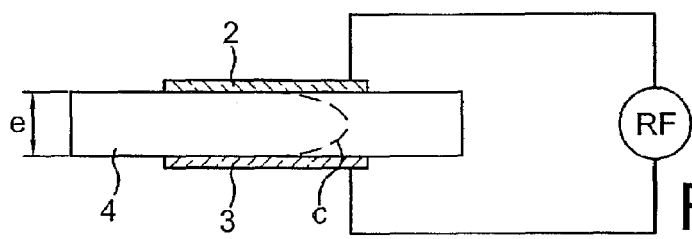
FIG. 1, already described, illustrates the principle of a standard bulk wave resonator.
Figure 2A:
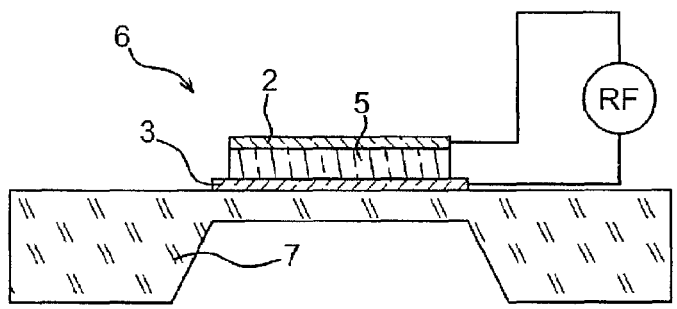
FIGS. 2A, 2B, 2C and 2D, already described, schematically illustrate various thin film resonant structures.
Figure 2B:
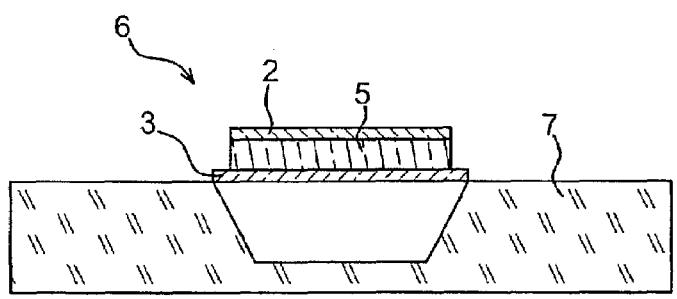
Figure 2C:
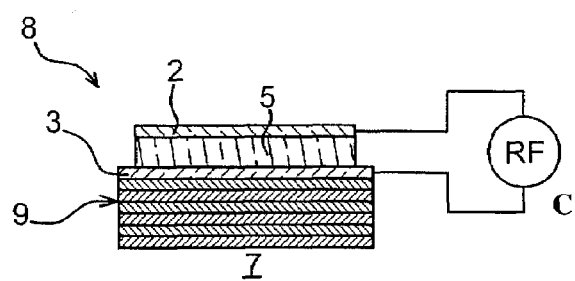
Figure 2D:
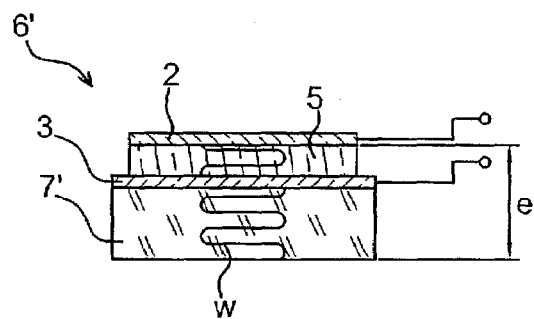
Figure 3:
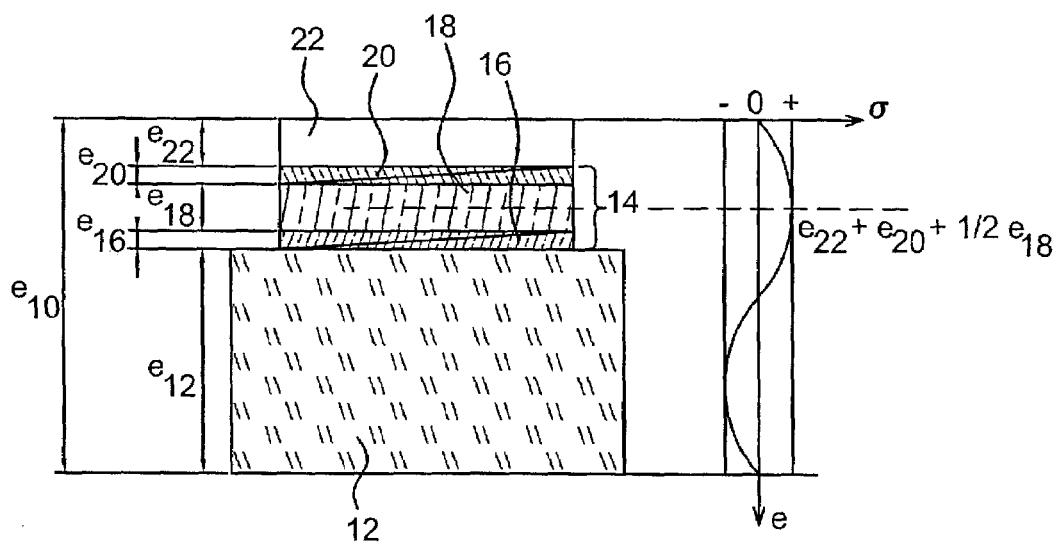
FIG. 3 shows a composite structure as described in the invention, and the position within it of the amplitude variation of stresses and deformations.

For a device which is in accordance with the invention, the diagram shown in FIG. 3 therefore shows the intensity of the deformation stress value σ inside (and facing) each layer in the device 10, in the optimum case where a stress anti-node (maximum intensity—in arbitrary units) is located at the centre of the piezoelectric layer.

As is illustrated in FIG. 3, a resonator 10 which is in accordance with the invention therefore includes a strip 12 of material serving as a substrate. The reduction in thickness of the substrate 12 to a given thickness may be carried out beforehand or during the manufacturing procedure for the resonator 10; it is also possible to modify the thickness of the substrate 12 once the resonator 10 has been made, for example by using the operation for adjustment of the resonance frequency of the device 10. According to the invention, the thicknesses are linked together using a calculation described later, so that the thickness $e_{12}$ of the strip acting as a substrate 12 is optimized according to the characteristics of the assembly of added layers and operating parameters for the resonant structure 10 (harmonic mode N, frequency $F_0$). It is advantageous if the substrate 12 is manufactured from a material which possesses the highest possible mechanical and dielectric quality factors, thus allowing a quality factor x resonance frequency product (QF) to be obtained for the useful mode which is greater than $3 \cdot 10^{12}$, for example a resonance quality coefficient for the useful mode which is greater than 8000 close to 400 MHz. For example, the material may be selected from amongst: crystalline or single-crystal quartz, glass or amorphous silica, langasite $La_3Ga_5SiO_{14}$ and its variants (langanite $La_3Ga_{5.5}Nb_{0.5}O_{14}$, langatate $La_3Ga_{5.5}Ta_{0.5}O_{14}$, etc. ...), gallium phosphate, sapphire, lithium niobate, lithium tantalate, diamond carbon, silicon carbide, etc.

A piezoelectric transducer 14 is placed on the substrate 12. The transducer 14 is made up of a first electrode 16, deposited on the surface of the strip 12; it is advantageous if the thickness $e_{16}$ of the layer forming the first electrode 16 is less than $\lambda_{16}/20$, where $\lambda_{16}$ is the wavelength of the acoustic wave which is propagated inside the layer. The first electrode is made up of a material which is preferably a good electrical conductor in order to minimize resistive losses. It is advantageous if it involves a metal (Al, Mo, Ni, Ag, Pt, Au, W, Cu, etc.), selected so that it can, if possible, be deposited in an oriented manner at the surface of the substrate 12. The electrode 16 is preferably deposited by epitaxy so that the piezoelectric layer 18 can also be manufactured using epitaxy so as to ensure that it is orientated.

This means that the transducer 14 is made up of a layer of piezoelectric material 18, put in place over the first electrode 16. The procedure for putting it in place, which depends on the nature of the piezoelectric material, is selected so as to minimize defects in the texture of the layer 18; these can act as sources of dissipation which adversely affect the confinement of the acoustic-electrical energy inside the thickness of the structure 10. Thus lithium niobate, potassium niobate, aluminum nitride, zinc oxide and other piezoelectric materials could be deposited by cathode sputtering. In more general terms, the piezoelectric layer may be deposited by cathode or laser sputtering, by metal organic chemical vapor deposition (MOCVD) or by molecular beam epitaxy (MBE), or obtained by epitaxial growth. One method of particular interest for the deposition of piezoelectric films 18 relies on the molecular adhesion of a thick layer on the thick substrate 12—first electrode 16 assembly, followed by erosion and polishing of the film 18 with adjustment to the required thickness: the use of any oriented single crystal may be envisaged for excitation, on any oriented mono-crystal for propagation.

The characteristics of the piezoelectric material 18 preferably allow electromechanical coupling greater than or equal to that of the surface waves on cut quartz (ST, X), that is 1‰, for the composite resonator 10, in the operating mode used. It is advantageous if materials with high coupling coefficients are used, such as aluminum nitride (AlN) or zinc oxide (ZnO), which are reasonably simple to apply by different methods, in particular on silicon.

Figure 4:
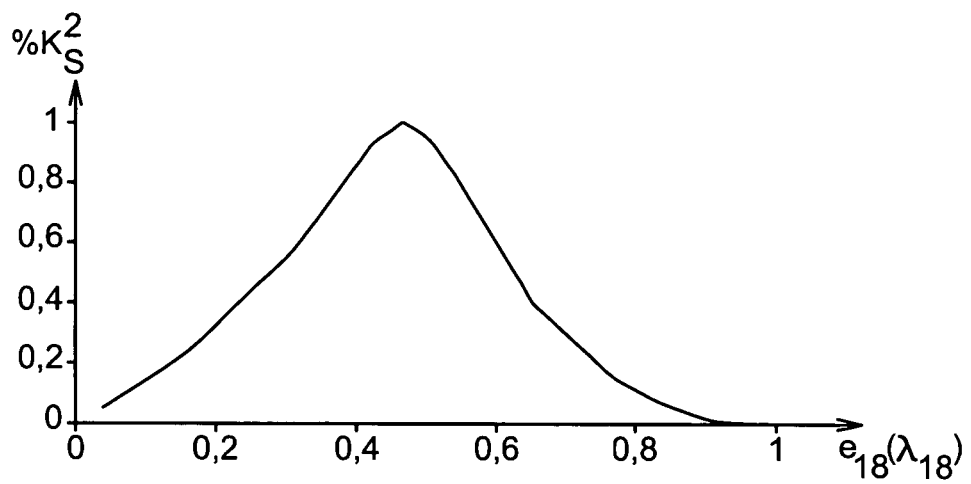
FIG. 4 represents the variation of the coupling coefficient as a function of the thickness of the piezoelectric layer.

For an acoustic wavelength $\lambda_{18}$ inside the piezoelectric layer 18, the variation of the dielectric coupling coefficient $K_S^2$ inside the layer 18 with the relative thickness of the piezoelectric layer $e_{18}$, here expressed as a fraction of the wavelength $\lambda_{18}$, is illustrated in FIG. 4: optimum coupling is obtained for a thickness of the layer $e_{18}$ which is equal to $\lambda_{18}/2$. A local optimum is also obtained for an odd multiple of $\lambda_{18}/2$, that is, it is advantageous if the thickness $e_{18}$ is of the form:

$$e_{18} = (2n' + 1) \cdot \frac{\lambda_{18}}{2},$$

where n' is a natural integer.

The thickness $e_{18}$ of the piezoelectric layer 18 which allows a useful coupling coefficient $K_S^2$ to be maintained that is greater than or equal to 20% of the maximum value, will be between $0.15 \cdot \lambda_{18} \leq e_{18} \leq 0.75 \cdot \lambda_{18}$. The thickness that is selected varies depending on the nature of the piezoelectric layer 18, the applications and the manufacturing technology limitations. For some applications, it is also possible to use values which are lower than the optimum thickness to limit coupling or to avoid technological problems in the manufacture of the layer.

For a given operating frequency $F_0$, the wavelength $\lambda$ is linked to the material properties as a function of the propagation velocity V of the wave in the material in accordance with the relationship $$\lambda = \frac{V}{F_0};$$

depending on the operating mode of the device 10 that is selected, the velocity V may relate to the compression velocity or the shear velocity for the material.

In the present case, therefore, we get:

$$e_{18} = (2n' + 1) \cdot \frac{V_{18}}{2 \cdot F_0},$$

where $V_{18}$ is the acoustic wave propagation velocity within the piezoelectric layer 18. As an example, for a piezoelectric layer 18 made of aluminum nitride AlN operating in compression mode, the change in thickness $e_{18}$ of the layer which enables optimum coupling to be obtained as a function of the operating frequency $F_0$ of the device 10 is as follows:

| $F_0$ (Hz) | $e_{18}$ (μm) |
|---|---|
| 433 | 13 |
| 866 | 6.5 |
| 2450 | 2.3 |

For indication purposes only, if x is the manufacturing factor, which varies with the material and its manufacturing procedures, as $$e_{18} = (n' + x) \cdot \frac{V_{18}}{F_0},$$

one tries to obtain n'=0 and x=0.5.

A counter electrode 20 is then deposited on the surface of the piezoelectric material 18. As in the case of the first electrode 16, this second electrode 20 is made up of a material which is preferably a good electrical conductor, advantageously made of metal which can be deposited in an oriented manner, or better yet, by epitaxy. Similarly it is advantageous if the thickness $e_{20}$ of the electrode layer 20 is less than $\lambda_{20}/20$, where $\lambda_{20}$ is the wavelength of the acoustic wave which is propagated inside the electrode material 20.

The surface facing the two electrodes 16, 20 allows the impedance and static capacitance parameters and therefore the resonance frequency of the structure 10 to be adjusted The structure 10 which is in accordance with the invention is preferably of the "HBAR" type, where energy is distributed in an almost homogeneous manner between the piezoelectric layer 18 and the substrate 12. These structures 10 are characterized by resonance at the harmonic of the substrate 12/piezoelectric layer 18 assembly, with a total active thickness $e_{10}$ of at least one wavelength. The acoustic energy is not confined to the piezoelectric layer 18, but on the contrary exists throughout the substrate 12. Conversely, in an "FBAR" type structure, the acoustic energy is naturally confined to the piezoelectric layer 18, and the structure is characterized by fundamental mode resonance of the piezoelectric layer 18 (a half-wave length or thereabouts).

This stack 12, 16, 18, 20 is supplemented, in the context of the invention, by an additional layer 22 which is deposited on the surface of the counter electrode 20. This additional element 22 is made up of one or more materials selected for their high mechanical and/or dielectric quality factors, in order to limit intrinsic losses in the device 10. It is advantageous if, depending on the nature of the counter electrode 20, the layer 22 is made using epitaxy, so that its orientation can therefore be guaranteed.

The layer 22 that is in accordance with the invention allows the acoustic-electrical energy of the useful mode to be concentrated in the piezoelectric layer 18. In the limiting case it involves an element for adjustment of the overall impedance of the device 10. In particular, for a resonant structure 10 of the HBAR type, this additional layer 22 is such that energy is not confined to the piezoelectric layer 18, although it significantly exists there, by the positioning of the stress anti-node in this layer 18.

The thickness $e_{22}$ of the additional layer 22 therefore depends on the thicknesses $e_{18}$ and $e_{12}$ of the piezoelectric layer 18 and of the substrate 12. It is advantageous if the growth in the additional layer 22 is such that this layer 22 has a texture that allows over-voltage values to be obtained which are sufficient to limit intrinsic losses in the device 10.

For some specific applications which do not require a high Q factor, this layer 22 may make up the upper electrode 20, whose thickness is then determined in the same manner as that of the additional layer 22 (and not $e_{20,22} \leq \lambda_{20,22}/20$). It is advantageous, however, if the material of the layer 22 is selected from materials used in the manufacture of the substrate 12, that is, and without being limited to these, single-crystal quartz, glass or amorphous silica, langasite and its variants (langanite, langatate etc.), gallium phosphate, sapphire, lithium niobate, lithium tantalate, diamond carbon, silicon carbide and so on. The additional layer may or may not have piezoelectric properties; it may also be made of aluminum nitride or potassium niobate.

The selected thicknesses of the various layers, and in particular of the strip 12, are calculated so that one of the harmonic resonances of order N ($N \geq 1$) for the stack 14, 22 corresponds to the operating frequency $F_0$ of the resonant structure 10.

In one preferred embodiment, the constituent parts are selected so that sensitivity to stress is as high as possible, so that after being integrated into a specific deformable structure, measurements can be made of effects of stresses induced by the deformation of the body in which it is located.

The method for calculation of the thickness of the additional layer 22 is identical to that of the substrate layer 12: each depends on the thickness used to create the piezoelectric layer 18. The thicknesses $e_{12}$ and $e_{22}$ are expressed as a function of the acoustic wavelength $\lambda_{12}$ and $\lambda_{22}$ propagated in respective layers 12, 22 (with the wavelength $\lambda_{12}$, $\lambda_{22}$ being associated with the compression or shear propagation speed $V_{12}$, $V_{22}$ of the acoustic wave within the respective materials 12, 22 at the operating frequency $F_0$).

If, because of manufacturing constraints, the thicknesses of the metallic layers intended for the manufacture of the electrodes 16, 20 are such that $$e_{16} \leq \frac{V_{16}}{20 \cdot F_0}$$

and $$e_{22} \approx e_{16} \leq \frac{V_{22}}{20 \cdot F_0},$$

they may be neglected, and the thickness of the structure 10 which is in accordance with the invention is given by $e_{10} = e_{12} + e_{18} + e_{22}$.

By considering an operating harmonic N of the structure for a frequency $F_0$, the thickness of each of the layers as a function of the speed of propagation of sound in their materials can be expressed as:

$$e_{12} = \left[ n \cdot \frac{V_{12}}{2} + (1 + 2x') \cdot \frac{V_{12}}{4} \right] \cdot \frac{1}{F_0}$$

$$e_{18} = (n' + x) \cdot \frac{V_{18}}{F_0}$$

$$e_{22} = \left[ n'' \cdot \frac{V_{22}}{2} + (1 - 2x') \cdot \frac{V_{22}}{4} \right] \cdot \frac{1}{F_0},$$

and therefore $$e_{10} = \left\{ \left[ n \cdot \frac{V_{12}}{2} + (1 - 2x') \frac{V_{12}}{4} \right] + (n' + x) \cdot V_{18} + \left[ n'' \cdot \frac{V_{22}}{2} + (1 - 2x') \frac{V_{22}}{4} \right] \right\} \cdot \frac{1}{F_0}$$

where $N = n + 2n' + n''$, with n, n' and n'' being natural integers (preferably $n' = 0$), where x a real number determined depending on the technological capabilities of the manufacturing process and optimized for the material ($0 \leq x \leq 1$, preferably $x = 0.5$) and where $x' = x \pm 20\%$ depending on manufacturing constraints, that is $0 \leq x' \leq 1.2$ which sets the tolerances in relation to optimized x.

In particular, and taking as an example the case of a structure 10 with a film 18 of aluminum nitride on a substrate 12 made of silicon, to the upper electrode 20 of which has been added a strip 22 of silicon of thickness equal to that used for the substrate 12 (symmetrical configuration), an improvement in the coupling coefficient $K_s^2$ by a factor of 5 to 10 has been observed relative to values without the upper strip 22.

For example, for a HBAR 10 made up of a substrate 10 made of silicon and a thin AlN piezoelectric layer 18, the coupling coefficient of standard solutions is about $K_s^2 = 0.0002$. With an additional layer 22 such as in accordance with the invention, it becomes 0.001, that is, 5 times better, thus reaching the coupling coefficient for a quartz resonator.

In fact, one cannot regard the addition of an additional layer as being obvious to those skilled in the art, since none of the published HBAR products include this additional layer which produces displacement of the stress anti-node.

These additional layers have certainly been described, but for different purposes and for FBAR structures. In particular, in document U.S. Pat. No. 4,642,508, the purpose of the additional layer is to reduce thermal sensitivity of the device as much as possible and to reduce the state of stress of the final device by relaxing the latter by means of compensation effects. The deposited layer ideally exhibits a state of stress that is equal and opposite to that of the piezoelectric film and its associated electrodes, and its thickness is not sufficient to displace the stress "anti-node" inside the stack. Similarly, simply placing Bragg mirrors on an FBAR structure, as presented in U.S. Pat. No. 6,087,198, in order to allow encapsulation to be carried out, is designed to keep acoustic energy confined within the piezoelectric layer.

Figure 5:
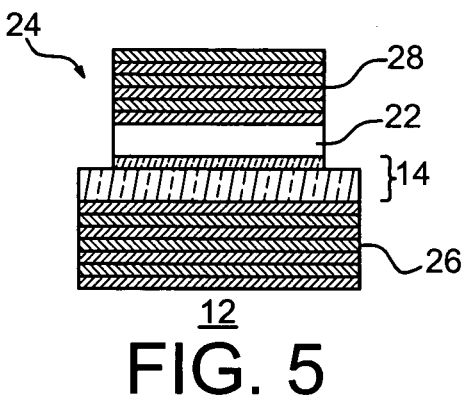
FIG. 5 shows another composite structure that is in accordance with the invention.

In addition, and by analogy with the TFR type structures in FIG. 2, it is possible to equip the resonator 10 which is in accordance with the invention with at least one Bragg mirror. A resonant structure 24, as illustrated in FIG. 5, therefore includes a Bragg mirror 26 on the lower surface of the transducer 14, between a substrate 12 and the first electrode 16, and/or a Bragg mirror 28 on the upper surface of the additional layer 22 designed to concentrate the energy (with, however $e_{10}=e_{12}+e_{18}+e_{22}$ for example).

As is usual, each Bragg mirror 26, 28 is made up of alternating layers of material of different reflection index, the thickness of which is an odd multiple of $\lambda/4$, where $\lambda$ is the wavelength of the wave propagated inside the network 26, 28: successive reflections at the various layers create a mirror effect; for example, the stacks are made up of alternating layers of Si and $Si_xN_y$. It is advantageous if the coefficient of reflection for each mirror 26, 28 is chosen to be at a maximum close to the resonance frequency for the structure.

The structure of the layers used to manufacture each mirror 26, 28 is selected so as to form a rejection band (that is, the spectral range in which the mirror carries out its function of total reflection of the waves) centered on a harmonic resonance. This itself is chosen for its own coupling, quality coefficient, and thermal sensitivity, etc. properties. In order to improve the spectral purity of the resonator 24, it may also be of interest to create a rejection band from a mirror 26 such that the width of the band is less than the difference between two harmonics in the resonance structure 24. According to one preferred embodiment, an acoustic absorbent, for example a layer of organic material, such as a polymer, in particular one with an epoxy resin base, is deposited on the surface of at least one Bragg mirror 26, 28. This allows the contribution towards the electrical response of the resonator 24 from modes which are not reflected by the mirror to be eliminated.

In the case where the use of a double mirror 26, 28 would prove useful, it is possible to adjust the respective structures of each of these mirrors so that their spectral response is slightly shifted: the filtering function is thus extended in relation to a configuration with a single mirror or with two symmetrical mirrors. It is advantageous if the front mirror 28 is shifted so that the resonance frequency $F_0$ selected is in the lower part of the rejection band and the rear mirror 26 is such that the resonance frequency $F_0$ is located in the upper part of the rejection band, or vice versa.

It is advantageous if the resonator 10, 24 which is in accordance with the invention operates in a frequency range of between 250 MHz and 6000 MHz and more specifically in bands reserved in various countries for radio applications using short range devices, and which are centered around the following values: 300 MHz, 433.92 MHz, 866 MHz, 915 MHz, 2441.75 MHz, 5250 MHz and 5825 MHz, together with useful respective associated bands: frequencies less than or centered around 1.74 MHz, 8 MHz, 26 MHz, 83.5 MHz, 200 MHz.

In particular, the resonator 10, 24 which is in accordance with the invention may be used in a passive manner, for example: as a simple transponder which may be remotely queried; or as a transponder associated with another device such as a sensor, to vary its resonance frequency; or as a sensor which converts a physical value into a frequency variation, with this sensor being able to be remotely queried by using the transponder function which is intrinsic to the device; or as a transponder associated with a means of modulating the information in order to form an identification device; or as a band filter, by associating several resonant structures together in series or in parallel. For example, if the QF product of two resonant structures is greater than or equal to $5 \cdot 10^{12}$, the assembly may be used to stabilize an oscillating circuit. The resonator may also be used in association with a battery or remote input as a frequency source.

Figure 6:
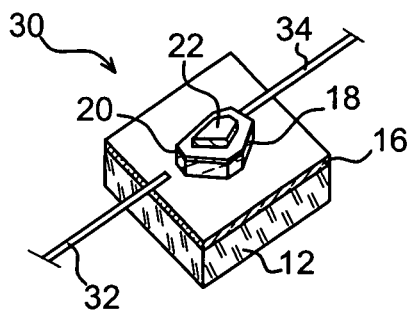
FIG. 6 illustrates the use of a structure which is in accordance with the invention as a transponder.

In one preferred embodiment, the resonator which is in accordance with the invention can be used as a transponder 30, as illustrated in FIG. 6. A resonator 10 is equipped with an antenna, here with duel strands 32, 34, which is connected to it: it is then possible to excite electrical resonance of the structure 10 by placing it in the field of a transmitter which is operating in the corresponding frequency range. After excitation, the natural frequency of the structure 12, 16, 18, 20, 22 will be re-transmitted and may be analyzed by using an appropriate device. It is therefore possible to produce a transponder 30 whose signal is controlled by the status of the structure at the time of reception.

Such a transponder 30 may be associated with another resonator 10, 24 which is in accordance with the invention. It is advantageous in this case for the difference between the impedances of the resonant structures to be minimized in order that they may be remotely queried whilst limiting the differential loss—in practice it would be desirable for the difference not to exceed 10%; thus the response is homogeneous between the various resonators.

In another preferred use, the resonant structure 10, 24, which is in accordance with the invention is produced using a set of materials which increases its sensitivity to temperature variations. For example, materials are preferably used whose coefficients of frequency variation as a function of temperature (CFT) have the same sign, so that the effects are cumulative, such as, for example, lithium niobate and silicon both of which have negative CFTs.

In another case, in order to minimize the sensitivity to variations of frequency, for example when the frequency band available for querying is small, two materials with counter-varying CFTs may be used, such as AlN and Si. Here the resonance frequency for the entire structure 10 then varies with the temperature, and it is possible to use the transponder function 30 to directly monitor changes in temperature variations, for example.

It is advantageous if two resonant structures 10 are used conjointly so that the frequencies of resonant structures exhibit opposite drift as a function of temperature, which allows the sensitivity of the assembly created in this way to be doubled. In particular, the sensitivity of electrical measurements may be optimized by placing the resonator with positive thermal frequency drift at the entry point of the allowed frequency band and that with the negative thermal frequency drift at the exit point of said band. The deviation between its base frequency and current frequency is determined for each resonator separately, and the sum of deviations measured for each resonator for the same temperature variation is equivalent to a thermal drift which is double that of the unitary value.

Conversely, if the set of materials selected is such that the temperature sensitivity of the useful resonance frequency (in the selected query band) is as small as possible, the resonant structure may then be queried as part of a specific deformable mechanical structure for direct measurement of stress effects: deformation of the mechanical structure results in the modification of acoustic properties of the resonator, which is expressed as a proportional variation of its(their) resonance frequency(ies). The deformable mechanical structure may be in the form of a rigid bar connected to a deformable membrane whose thickness is adjusted so as to optimize the range of stresses to be measured and the useful resonance, representative of the information that is sought. For example, in a MEMS which involves active strain gauges associated with the membrane, the gauges may be replaced by a structure which is in accordance with the invention in order to render the MEMS passive.

It is furthermore possible to arrange several resonant structures which are in accordance with the invention on the same deformable mechanical structure, with some of these being arranged on areas sensitive to stress and others on parts which are unaffected by stress or on a neutral fiber in order to provide a reference. The measurement of changes in each frequency in relation to the fixed reference therefore, on the one hand allows the residual thermal drift to be isolated and on the other hand allows the effects of stress to be measured; one can also obtain increases in the direction (sign) of the effects to be measured. In the same way, in order to do away with temperature measurements, it is possible to use a reference which exhibits a temperature sensitivity which is equal to that of the test piece, so that the frequency difference between the reference resonator and the measurement resonators is constant irrespective of the working temperature.

In another use, the resonant structure which is in accordance with the invention may be coupled in series to a capacitive test piece the value of which varies as a function of a physical parameter to be measured: the resonance frequency varies as a function of the capacitance. The set of elements making up the resonant structure is selected such that the useful resonance frequency sensitivity (in the selected query band) is as small as possible, and the geometry is chosen so as to optimize electromechanical coupling in order to measure capacitance by frequency sampling: Querying is then carried out by using the resonant structure transponder function to directly monitor changes in the capacitance variations. It is advantageous if the resonant structure has a static capacitance value close to the capacitance to be characterized.

In order to maximize sensitivity, the structure is in this case designed so that the resonator static capacitance is substantially equal to the typical capacitance of the test piece. In order to further improve sensitivity, it is possible to use a set of at least two resonant structures one of which is coupled to the test piece, with the other being used as a reference. It is also possible to use the invention by coupling the capacitive test piece in parallel.

Irrespective of the use that is planned for the invention, in the configuration where the resonant structure is equipped with one or more Bragg mirrors which overcome the need to have free surfaces, the inclusion of a face or the entire structure which is in accordance with the invention within an embedding material could be envisaged. Depending on the application, this embedding could serve as housing. When the invention is used as a passive transponder, whether partial or total, the covering allows antenna wires to pass through it or includes antenna wires. It is advantageous if an embedding material is selected which could be used to perform an acoustic absorbent function, such as, for example, a plastic or any polymer based on organic components. The absence of a housing other than the encapsulation and the integration of all the antenna and absorbent functions in the embedding means a significant reduction in the final cost of the transponder.

A sensor which is in accordance with the invention may be used in a number of fields, in particular in any application requiring the measurement of physical values (pressure, stress, temperature, acceleration etc.) in a hostile environment, in industry for the inspection and remote measurement in production lines or in medicine, the agro-food industries through to control of flows of equipment in transit or yet again in home automation; this list is not restrictive.

In particular, resonators which are in accordance with the invention exhibit: a significant over-voltage so as to determine frequency and variation with sufficient precision; very low insertion losses so that received energy is not uselessly dissipated on transduction; resistance towards hostile environments that they are likely to be exposed to either when fitted or during use, for example with a temperature of between −50° C. and 500° C.

Each patent, patent application, publication, text and literature article/report cited or indicated herein is hereby expressly incorporated by reference.

While the invention has been described in terms of various specific and preferred embodiments, the skilled artisan will appreciate that various modifications, substitutions, omissions, and changes may be made without departing from the spirit thereof. Accordingly, it is intended that the scope of the present invention be limited solely by the scope of the following claims, including equivalents thereof.

What is claimed is:

1. An acoustic resonant structure comprising a support and a piezoelectric transducer, which includes a first conductive electrode put in place on the support and a second conductive electrode, separated by a layer of piezoelectric material, with the thickness of the layer of piezoelectric material being given by the relationship $$e_{18} = (n' + x) \cdot \frac{V_{18}}{F_0},$$

where n' is a natural integer, x a real number of approximately 0.5, $V_{18}$ is the propagation velocity of the acoustic wave in the piezoelectric material and $F_0$ is the operating frequency of the resonant structure, and an additional layer put in place on the surface of the second electrode opposite the piezoelectric layer, with the thickness of the additional layer being fixed so as to optimize the acoustic-electric density within the piezoelectric layer, wherein the resonant structure is of an HBAR type.

2. Resonant structure according to claim 1, wherein the support is in the form of a strip of substrate made up of a material which possesses high mechanical and dielectric quality factors in order to achieve a quality factor multiplied by a useful mode resonance frequency product of more than $3 \cdot 10^{12}$.

3. Resonant structure according to claim 2 wherein the substrate is made up of a single silicon crystal or is made of a material from amongst: crystalline quartz, glass or amorphous silica, langasite and its langanite and langatate derivatives, gallium phosphate, sapphire, lithium niobate, lithium tantalate, diamond carbon or silicon carbide.

4. Resonant structure according to claim 1 wherein the layer of piezoelectric material is a thin layer of aluminum nitride.

5. Resonant structure according to claim 1 wherein the additional layer is made up of at least a mono-crystalline material and/or one of the following materials: aluminum nitride, crystalline quartz, glass or amorphous silica, langasite and its langanite and langatate variants, gallium phosphate, sapphire, lithium niobate, lithium tantalate, diamond carbon, silicon carbide, and potassium niobate.

6. Resonant structure according to claim 1 further comprising, on the additional layer and/or as a support for the transducer, a Bragg mirror which is made up of alternating layers with different reflection coefficients and whose reflection coefficient is a maximum close to the resonance frequency of the acoustic structure.

7. Resonant structure according to claim 6 further including a layer coating the structure at the Bragg mirror at least.

8. Resonant structure according to claim 1 wherein the first and/or second electrodes are metal layers respectively deposited on or integrated into the support and the layer of piezoelectric material.

9. Resonant acoustic structure according to claim 1 in which the thickness of the additional layer is given by the relationship:

$$e_{22} = \left[ n'' \cdot \frac{V_{22}}{2} + (1 - 2x') \cdot \frac{V_{22}}{4} \right] \cdot \frac{1}{F_0},$$

where n'' is a natural integer, $V_{22}$ is the propagation velocity of the acoustic wave within the additional layer, and x'=x±20%.

10. Resonant acoustic structure according to claim 1 associated with a variable capacitance.

11. Frequency filter made up of an assembly of several resonant structures according to claim 1.

12. Radiofrequency transponder which includes an antenna associated with a resonant structure according to claim 1.

13. Transponder according to claim 12 associated with at least one second resonant acoustic structure comprising a support and a piezoelectric transducer, which includes a first conductive electrode put in place on the support and a second conductive electrode, separated by a layer of piezoelectric material, with the thickness of the layer of piezoelectric material being given by the relationship $$e_{18} = (n' + x) \cdot \frac{V_{18}}{F_0},$$

where n' is a natural integer, x is a real number of approximately 0.5, $V_{18}$ the propagation velocity of the acoustic wave in the piezoelectric material and $F_0$ is the operating frequency of the resonant structure, and an additional layer put in place on the surface of the second electrode opposite the piezoelectric layer, with the thickness of the additional layer being fixed so as to optimize the acoustic-electric density within the piezoelectric layer, where the characteristics of each resonant structure allow differential temperature measurements to be made.

14. Transponder according to claim 12 associated with at least one resonant acoustic structure comprising a support and a piezoelectric transducer, which includes a first conductive electrode put in place on the support and a second conductive electrode, separated by a layer of piezoelectric material, with the thickness of the layer of piezoelectric material being given by the relationship $$e_{18} = (n' + x) \cdot \frac{V_{18}}{F_0},$$

where n' is a natural integer, x is a real number of approximately 0.5, $V_{18}$ the propagation velocity of the acoustic wave in the piezoelectric material and $F_0$ the operating frequency of the resonant structure, and an additional layer put in place on the surface of the second electrode opposite the piezoelectric layer, with the thickness of the additional layer being fixed so as to optimize the acoustic-electric density within the piezoelectric layer, where the impedances of the various acoustic structures differ by less than 10%.

15. Resonant structure according to claim 1, wherein the support is in the form of a strip of substrate made up of a material which possesses high mechanical and dielectric quality factors in order to achieve a quality factor multiplied by a useful mode resonance frequency product of $5 \cdot 10^{12}$.

16. Process for manufacturing a resonant structure, which includes:
   putting in place a first electrode layer on a support,
   putting in place a piezoelectric layer on the first electrode,
   putting in place a second electrode on the piezoelectric film, and
   putting in place an additional layer of material on the second electrode, with the thickness of the additional layer being determined so as to optimize the electro-acoustic density within the piezoelectric film,
   wherein the resonant structure is of an HBAR type.

17. Process according to claim 16 wherein the piezoelectric film is added onto the first electrode using molecular adhesion.

18. Process according to claim 17 wherein the first electrode is deposited on a support made up of a flat substrate made up of mono-crystalline quartz.

19. Process according to claim 16 including the putting in place of a Bragg mirror on the additional layer and/or first electrode is deposited on a support which includes a Bragg mirror.

20. Process according to claim 19 which includes embedding at least the Bragg mirror.

21. Acoustic resonant structure comprising:
   a strip of substrate made up of a material from amongst: crystalline quartz, glass or amorphous silica, langasite and its langanite and langatate derivatives, gallium phosphate, sapphire, lithium niobate, lithium tantalate, diamond carbon, silicon carbide, a silicon single crystal,
   a piezoelectric transducer which includes two conductive electrodes separated by a piezoelectric film,
   an additional layer made of at least one of the following materials: aluminum nitride, crystalline quartz, glass or amorphous silica, langasite and its langanite and langatate variants, gallium phosphate, sapphire, lithium niobate, lithium tantalate, diamond carbon, silicon carbide, and potassium niobate,
   wherein the substrate and the additional layer are coupled on either side of the piezoelectric transducer and the thickness or the piezoelectric layer is fixed so as to displace the stress anti-node towards the piezoelectric layer and to optimize its electro-acoustic density, and
   wherein the resonant structure is of an HBAR type.

22. Resonant structure according to claim 21 further comprising a Bragg mirror on the additional layer and a coating layer at least on the Bragg mirror.

23. Radiofrequency transponder which includes an antenna and at least one resonant structure according to claim 21.

* * * * *

UNITED STATES PATENT AND TRADEMARK OFFICE
CERTIFICATE OF CORRECTION

| | | |
|---|---|---|
| PATENT NO. | : 7,609,132 B2 | Page 1 of 1 |
| APPLICATION NO. | : 11/494555 | |
| DATED | : October 27, 2009 | |
| INVENTOR(S) | : Sylvain Jean Ballandras et al. | |

It is certified that error appears in the above-identified patent and that said Letters Patent is hereby corrected as shown below:

Column 13, in claim 13, line 47, insert --is-- before "the propagation".

Column 14, in claim 14, line 2, insert --is-- before "the propagation";

line 3, insert --is-- before "the operating".

Signed and Sealed this

Eighteenth Day of January, 2011

David J. Kappos
*Director of the United States Patent and Trademark Office*